(12) United States Patent
Purushothaman et al.

(10) Patent No.: US 8,912,050 B2
(45) Date of Patent: Dec. 16, 2014

(54) CAPPING COATING FOR 3D INTEGRATION APPLICATIONS

(75) Inventors: Sampath Purushothaman, Yorktown Heights, NY (US); Anna W. Topol, Jefferson Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/607,744

(22) Filed: Sep. 9, 2012

(65) Prior Publication Data

US 2012/0329244 A1    Dec. 27, 2012

Related U.S. Application Data

(62) Division of application No. 12/192,367, filed on Aug. 15, 2008, now Pat. No. 8,778,736, which is a division of application No. 10/645,047, filed on Aug. 21, 2003, now abandoned.

(60) Provisional application No. 60/444,502, filed on Feb. 3, 2003.

(51) Int. Cl.
| | |
|---|---|
| H01L 25/00 | (2006.01) |
| H01L 23/31 | (2006.01) |
| H01L 21/683 | (2006.01) |
| H01L 21/56 | (2006.01) |

(52) U.S. Cl.
CPC ... *H01L 21/6835* (2013.01); *H01L 2221/68359* (2013.01); *H01L 2225/06513* (2013.01); *H01L 2924/00014* (2013.01); *H01L 25/50* (2013.01); *H01L 23/3164* (2013.01); *H01L 2924/01015* (2013.01); *H01L 2224/45147* (2013.01); *H01L 21/56* (2013.01)
USPC .......................... 438/118; 438/458; 438/761

(58) Field of Classification Search
None
See application file for complete search history.

(56) References Cited

U.S. PATENT DOCUMENTS

| | | | |
|---|---|---|---|
| 3,644,166 A | 2/1972 | Gause | |
| 4,075,367 A | 2/1978 | Gulett | |
| 4,330,569 A | 5/1982 | Gulett et al. | |
| 4,423,547 A | 1/1984 | Farrar et al. | |
| 4,529,618 A * | 7/1985 | Ponjee et al. | 430/327 |
| 5,081,005 A | 1/1992 | Chakravorty et al. | |
| 5,114,754 A | 5/1992 | Cronin et al. | |
| 5,194,928 A | 3/1993 | Cronin et al. | |

(Continued)

FOREIGN PATENT DOCUMENTS

EP         251347  A1      1/1988

OTHER PUBLICATIONS

U.S. Office Action dated Oct. 8, 2013 issued in related U.S. Appl. No. 12/192,367.

(Continued)

*Primary Examiner* — David E Graybill
(74) *Attorney, Agent, or Firm* — Scully, Scott, Murphy & Presser, P.C.; Daniel P. Morris, Esq.

(57) ABSTRACT

A structure for a semiconductor component is provided having a bi-layer capping coating integrated and built on supporting layer to be transferred. The bi-layer capping protects the layer to be transferred from possible degradation resulting from the attachment and removal processes of the carrier assembly used for layer transfer. A wafer-level layer transfer process using this structure is enabled to create three-dimensional integrated circuits.

9 Claims, 1 Drawing Sheet

(56) References Cited

U.S. PATENT DOCUMENTS

| | | | |
|---|---|---|---|
| 5,287,003 | A | 2/1994 | Van Andel et al. |
| 6,424,038 | B1 | 7/2002 | Bao et al. |
| 6,669,801 | B2 * | 12/2003 | Yoshimura et al. ............ 156/230 |
| 2002/0036055 | A1 * | 3/2002 | Yoshimura et al. ............ 156/234 |
| 2004/0150096 | A1 | 8/2004 | Purushothaman et al. |

OTHER PUBLICATIONS

Perfecto, E. et al., Evaluation of Cu Capping Alternatives for Polyimide-Cu MCM-D, Elec. Comp. Tech. Conf., IEEE, 2001.

Prasad, K. et al., Multilevel Thin Film Packaging: Applications and Processes for High Performance Systems, Trans. Comp. Pac. Man. Tech.—Pt. B: Adv. Pac., IEEE, Feb. 1994, pp. 38-49, vol. 17, No. 1.

Shih, D.-Y. et al., Cu Passivation: A Method of Inhibiting Copper-Polyamic Acid Interactions, Appl. Phys. Lett., Sep. 16, 1991, pp. 1424-1426, vol. 59, No. 12.

Ohuchi, F. S. et al., Summary Abstract: Ti as a Diffusion Barrier Between Cu and Polyimide, J. Vac. Sci. Technol. A, May/Jun. 1988, pp. 1004-1006, vol. 6, No. 3.

O'Sullivan, E. J. et al., Electrolessly Deposited Diffusion Barriers for Microelectronics, IBM J. Res. Develop., Sep. 1998, pp. 607-620, vol. 42, N. 5.

Srinivasan, R. et al., Ultraviolet Laser Ablation of Organic Polymers, Chem. Rev., 1989, pp. 1303-1316, vol. 89.

Kowalczyk, Steven P. et al., Polyimide on Copper: The Role of Solvent in the Formation of Copper Precipitates, Appl. Phys. Lett., Feb. 1988, pp. 375-376, vol. 52, No. 5.

Kim, Y.-H. et al., Adhesion and Interface Investigation of Polyimide on Metals, J. Adhesion Sci. Technol., 1988, pp. 95-105, vol. 2, No. 2.

Lee, K.-W. et al., Adhesion of Poly(arylene ether benzimidazole) to Copper and Polyimides, J. Adhesion Sci. Technol., 1996, pp. 807-821, vol. 10, No. 9.

Matienzo, Luis J. et al., Adhesion of Metal Films to Polyimides, IBM Corp., Endicott, NY.

Linde, H. G., Adhesive Interface Interactions Between Primary Aliphatic Amine Surface Conditioners and Polyamic Acid/Polyimide Resins, J. Poly. Sci.: Poly. Chem. Ed., 1982, pp. 1031-1041, vol. 20.

H. Ishida et al. entitled "Modified Imidazoles: Degradation Inhibitors and Adhesion Promoters for Polyimide Films on Copper Substrates", J. Adhesion, 1991, pp. 177-191, vol. 36.

* cited by examiner

CAPPING COATING FOR 3D INTEGRATION APPLICATIONS

CROSS REFERENCE TO RELATED APPLICATION

This application is a divisional of U.S. patent application Ser. No. 12/192,367 filed Aug. 15, 2008, which is a divisional of U.S. patent application Ser. No. 10/645,047 filed Aug. 21, 2003 which claims benefit of U.S. Provisional Application 60/444,502, filed Feb. 3, 2003, entitled "Silicon Nitride/A110 Capping Bi-Layer in Copper-Polyimide Systems for 3D Integration Applications".

FIELD OF THE INVENTION

The present invention relates to the integration of circuit components into a 3D structure using a wafer-level layer transfer process based on the incorporation of capping bi-layers for reliable connection of integrated circuits, components, and other semiconductor components.

BACKGROUND OF THE INVENTION AND DESCRIPTION OF THE PRIOR ART

In recent years, a variety of three-dimensional (3D) integration and packaging techniques have been examined. The main considerations behind the use of 3D integration are: 1) minimization of the wire length, 2) incorporation of new back-end-of-the-line (BEOL) processes that are currently limited by conventional planar technology, and 3) implementation of related design flexibility. Items 1-3 mentioned above would allow significantly reduced interconnect delay as well as a complex system integration to increase both performance and functionality.

Approaches to 3D integration at either the chip or wafer level have been described in the prior art. For example, wafer level bonding can be achieved via an assembly approach. In such a method, layers are transferred one by one, on top of each other, and attached by a bonding process. The prior art layer transfer process is realized using carrier wafers, most often a glass substrate.

In such a scheme, the glass substrate is attached to the structure by an adhesive bonding process and released after the layer transfer is completed. One of the methods to release glass is based on laser ablation, which entails irradiating the glass/adhesive interface through the back surface of the glass substrate. In order to accomplish the ablation process, polyimide materials are typically used as a sacrificial adhesive layer in prior art 3D integration schemes. The polyimide sacrificial adhesive layers are deposited on top of the layer that will be subsequently transferred. During ablation, the deposited energy is contained within a shallow (submicron) surface layer for an approximate 50 ns duration of the excimer laser pulse due to the polyimides strong absorption properties of ultraviolet laser radiation and poor thermal conductivity. When the absorbed energy density exceeds a certain threshold value, a surface layer having a thickness of less than 1 µm is photo-ablated and the laser separation of the glass carrier substrate is realized. The laser ablation process using polyimides has been reported and a comprehensive summary has been provided by Srinivasan, et al., "Ultraviolet Laser Ablation of Organic Polymers", Chem. Rev. 990, 1303-1316 (1989).

The assembly approach in which laser ablation is used is only one of the examples in which the polyimide material is used in a 3D integration scheme. In general, in 3D structures, the polyimide layer is deposited on an already processed and tested device layer terminated with at least one Cu-based wiring layer. When a polyamic acid (PAA) solution, which is the precursor for the formation of polyimide films, is spin applied to the Cu surface and subsequently cured at a temperature between 350°-400° C., Cu reacts with the polyamic acid during the curing step to form salts which diffuse into the polyimide layer to form copper oxide precipitates. This is disclosed, for example, in Kim, et al., "Adhesion and Interface Investigation of Polyimides on Metals", J. Adhesion Sci. Technol., Vol. 2, No. 2, pp. 95-105 (1988). As demonstrated by Kowalczyk, et al., "Polyimide in Copper: The Role of Solvent in the Formation of Copper Precipitates", Appl. Phys. Lett., Vol. 52, No. 5, pp. 375-376, (1988), the polyimide precursor solvent, n-methyl pyrrolidone (NMP), provides mobility for the aggregation of Cu precipitates.

This situation is worsened when photosensitive polyimides are used since reacted Cu leaves a residue upon development, which is very difficult to clean; see, in this regard, Perfecto, et al. "Evaluation of Cu Capping Alternatives for Polyimide-Cu MCM-D", ECT. '01 (2001). In the case of a preimidized polyimide, Cu diffusion has been observed and documented in U.S. Pat. No. 5,081,005. Over the years, the copper-polyimide interface has been well studied. Copper-polyimide technology has been successfully used in the form of multi-level thin film structures for over two decades now. It has been primarily developed for use in the cost/performance SCM's and high end MCM's applications; see, for example, Prasad, et al., "Multilevel Thin Film Applications and Processes for High and Systems", IEEE Transactions and Components, Packaging, and Manufacturing Technology-Part B, Vol. 17, No. 1, pp. 38-49 (1994).

In these applications, to prevent copper diffusion into the polyimide, various metal capping layers have been used. Illustrative examples of prior art polyimide capping layers include, for example, Cr, Pt, Pd, Ti, Co(P), and chromate treatment; see, in this regard Matienzo, et al., "Adhesion of Metal to Polyimides, in Polyimides: fundamentals and applications", K. K. Ghosh and K. L. Mittal Eds., Marcel Dekker, NY, N.Y. (1996); Shih, et al., "Cu passivation: a method of inhibiting copper-polyamic acid interactions", Appl. Phys. Lett., Vol. 59, No. 12, pp. 1424-1426 (1991); Ohuchi, et al., "Summary Abstract: Ti as a diffusion barrier between Cu and polyimide", J. Vac. Sci. Technol. A, Vol. 6, No. 3, pp. 1004-1006 (1988); O'Sullivan, et al., "Electrolessly deposited diffusion barriers for microelectronics", IBM J. Res. Develop., Vol. 42, No. 5, pp. 607-619 (1998).

Also, baseline requirements for a capping layer in the Cu-polyimide system used for various packaging structures have been established. Namely, any Cu passivation metal should be chemically inert and insoluble in PAA; and the passivation metal should be a good diffusion barrier against Cu outdiffusion at temperatures less than 100° C. when the solvent NMP is present (above this temperature the Cu transports into the polyimide via solid-state-diffusion). Moreover, the passivation metal should not diffuse into Cu to cause resistivity increase.

In addition to copper diffusion barrier properties, metal caps were found to enhance adhesion between Cu and a polyimide. The shortcoming of this Cu/metal cap/polyimide is based on the processing limitation, for example, when the metal wiring is defined by the subtractive etching of a Cr/Cu/Cr sputtered film, Cr protection only occurs on the top of the wiring. Similar problems take place when a metal is deposited by a lift-off process. Hence, this solution has been limited to pattern electroplated films, where Co or chromate treatments have been shown to successfully encapsulate the Cu wiring.

However, in case of 3D integration applications, the concern about metal capping layers is based on compatibility of these materials with various heterogeneous structures involved in future 3D integration schemes. The capping could be introduced as a continuous layer across the whole wafer. In this case, after the layer transfer and ablation of the glass substrate is completed, this layer would be exposed to the removal of the polyimide (the removal step is not present in the aforementioned packaging applications). Wet and dry methods have been used to remove polyimides, but oxygen-plasma based removal has been proven most effective, and it is also is a well understood process.

Therefore, in case of 3D structures, requirement of good Cu-diffusion barrier (specially against activated oxygen in a plasma etching environment) is additionally mandated of the capping layer. Since titanium is prone to oxidation in an oxygen-plasma, it cannot be considered as a candidate for a capping layer. Even if other capping metal candidates are stable in the oxygen-plasma environment, once the polyimide stripping process has been completed, the additional step of removing the sacrificial capping layer would have to be implemented in order to provide electrical separation between Cu wires. This removal process needs to be CMOS compatible, and preserve the structural, mechanical and electrical stability of the underlying patterned structures. Selective etching of such capping metals without degrading (etching or damaging) the underlying copper wires makes the choice of such a metal cap layer even more difficult. Taking all these restrictions into consideration, the metal capping-sacrificial coating of a full wafer is not likely to be feasible from the manufacturing point of view.

The metal capping in the form of a selective cap, such as electroless Co on the top of Cu structures, could be implemented in a 3D integration scheme. However, application of such a cap will be limited, as 3D structures may implement various heterogeneous materials and their compatibility with Co, or other relevant selective metal caps would have to be established.

The organic copper-capping technology for the Cu-polyimide system was also developed for thin film packaging. It has been shown that a thin organic coating, such as poly (arylene ether benzimidazole) (PAEBI), silane-modified polyvinylimidazole, or polybenzimidazole, can be applied directly to a wiring layer for enhancing adhesion to both the copper wiring and the polymer dielectric surface. These materials provide 100% protection for copper wiring, eliminating the need for metal capping, but at the expense of adding a thermal treatment step prior to the coating of the polyimide. This is described, for example, in Lee, et al., "Adhesion of poly (arylene ether benzimidazole) to copper and polyimides", J. Adhesion Sci. Technol., Vol. 10, No. 9, pp. 807-821 (1996); and Ishida, et al., "Modified Imidazoles: degradation inhibitors and adhesion promoters for polyimide films on copper substrates", J. Adhesion, Vol. 36, pp. 177-191 (1991). Such predominantly organic caps will be attacked by oxygen plasma exposure and will not protect the copper wires during the post ablation cleaning step of plasma ashing.

Organic caps that do not require additional thermal treatments have been evaluated by Perfecto, et al., "Evaluation of Cu capping alternatives for cu-Cu MCM-D, ECTC"01 (2001).

Two approaches were investigated in the Perfecto, et al. paper: 1) re-formulation of the PAA with an additive which will reduce the Cu diffusion and/or prevent Cu from complexing with the PAA, and 2) spun dry precoat of a Cu surface with an organic solution that reacts with Cu reducing the availability of Cu for diffusion. In the first method, 1% tetrazole in a polyimide solution, and 5% benzotriazole (BTA) in a polyimide solution were evaluated, while in the second method an amino silane, namely, 3-aminopropyl-trimethoxy silane diluted to 1% in deionized water, as well as BTA diluted to 1% NMP were studied. All systems showed degraded performance when compared to the simplest and most robust process of coating copper with 3-aminopropyl-trimethoxy silane. A layer of 3-aminopropyl-trimethoxy silane exhibited superior performance as an adhesion promoter in the Cu-polyimide system, and as a Cu-diffusion limiting layer, and its use as a capping layer in package-related applications has been described in U.S. Pat. Nos. 5,081,005 and 5,194,928.

However, a coating of 3-aminopropyl-trimethoxy silane (usually a few monolayers) is not stable in the plasma-environment, and hence it cannot serve as an oxygen-diffusion barrier. Therefore, its use as a capping layer in the 3D integration applications is limited to schemes when no oxygen-plasma processes are involved. However, other characteristics of 3-aminopropyl-trimethoxy silane, such as its ability to promote interfacial strength in both polyimide/silicon dioxide and silicon/silicon nitride laminates, make this system a great candidate in the scheme for capping layer discussed below.

In view of the above, there is a need for providing an improved capping layer which provides adhesion as well as protection to underlying layers such as metal-based semiconductor elements.

SUMMARY OF THE INVENTION

The present invention relates to the three-dimensional integration of semiconductor elements, such as devices and interconnections, using a novel layer transfer process. Moreover, the present invention overcomes the difficulties associated with the integration of various materials and devices through the use of a passivation capping coating to protect the underlying metal-based semiconductor elements. The inventive process provides a wafer-level layer transfer that is compatible with CMOS technology and enables integration of various active, passive and interconnecting circuit elements.

In particular, it is an object of this invention to provide a supporting structure for an integrated 3D interconnect circuit for high frequency and high speed computing applications.

It is a further object of the present invention to combine the know-how of layer transfer technology to form a complete high density interconnect structure with integrated functional components.

It is a still further object of this invention to enable a low cost of ownership process based on a bi-layer capping coating using an adhesive component and a diffusion barrier component.

Specifically, and in broad terms, the present invention provides a structure for interconnecting semiconductor components comprising:
   a layered substrate including, for example, semiconductor components, for transferring;
   a bi-layer capping coating on top of the substrate, each layer of said coating provides adhesion and protection; and
   a carrier assembly.

The inventive structure can be used for interconnecting various semiconductor components including, for example, semiconductor devices, semiconductor circuits, thin film layers, passive and/or active elements, interconnect elements, memory elements, micro-electro-mechanical elements, optical elements, optoelectronic elements, and photonic elements.

In addition to the above-mentioned structure, the present invention also provides a method for fabricating the same. Specifically, and in broad terms, the method of the present invention comprises the steps of:

providing a layered substrate for transferring;

forming a bi-layer capping coating on the substrate, each layer of coating providing protection and adhesion; and forming a carrier assembly on the bi-layer capping coating.

The bilayer capping coating of the present invention is formed by depositing at least two consecutive layers, hence creating a bi-layer protecting the substrate to be transferred from negative effects of attachment and the later removal of the carrier assembly.

The present invention also provides a method for wafer-level transfer that comprises the steps of:

providing a layer to be transferred on a semiconductor substrate;

forming a first layer of a capping coating on the layer to be transferred, said first layer provides adhesion and protection from oxidation;

forming a second layer of a capping coating on said first layer, said second layer provides additional protection and adhesion to a carrier assembly;

adhering the carrier assembly to a carrier wafer by means of an adhesive; and removing the semiconductor substrate whereby said layer to be transferred is attached to the carrier assembly.

DESCRIPTION OF THE PREFERRED EMBODIMENT

Figure 1:
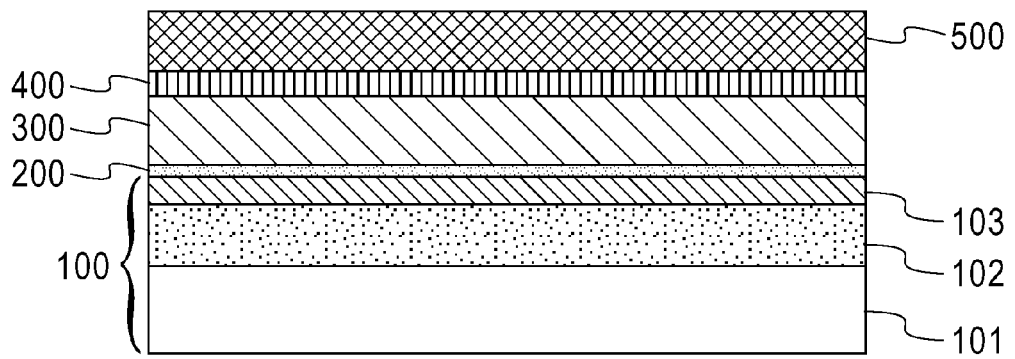
FIG. 1 is a schematic representation of a prior art structure including a single-layer capping coating.

The present invention relates to a method for manufacturing 3D integrated structures based on an assembly approach in which a layer-to-be transferred is coated with a bi-layer capping stack, a polyimide layer, and an adhesive layer. That structure is then bonded to a glass carrier-wafer and upon removal of the bulk silicon, it is transferred to a new circuit, and attached to this new circuit using bonding techniques such as, for example, adhesive bonding. In the subsequent step, the glass layer is released (for example, by laser ablation), and the residual polyimide layer is removed by plasma ashing using oxygen.

The aforementioned protecting capping stack is comprised of two layers including a first layer of silicon nitride and a second layer of an amino silane deposited over the whole area of the wafer. Such a bi-layer cap provides not only protection from both Cu and oxygen diffusion, but it presents a SiC-MOS-compatible and reliable solution for use in the 3D applications where Cu-polyimide layers are present. The thickness of the first and second layers of the inventive bi-layer capping coating may vary depending on the conditions used for depositing each of the layers. Typically, the SiN layer has a thickness of from about 100 to about 1000 nm, while the amino silane has a thickness of a few monolayers. Other thickness besides the ranges mentioned herein are also contemplated herein The term "amino silane" is used in the present invention to denote a compound that has the formula:

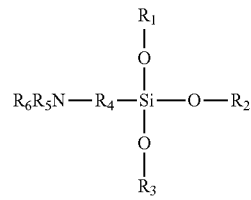

wherein $R_1$, $R_2$, $R_3$, $R_5$, and $R_6$, independently of each other, can be hydrogen or an organic radical such as, for example, a lower alkyl radical containing from 1 to about 6 carbon atoms, an acyl radical containing 1 to 6 carbon atoms, or an allyl, alkenyl or alkynyl radical containing 2 to 6 carbon atoms and $R_4$ can be an organic radical such as, for example, a lower alkyl containing from 1 to about 6 carbon atoms or an aromatic system such as, for example, phenyl or benzyl derivative. Illustrative examples of amino silanes that can be employed in the present invention as the second layer of the bi-layer capping coating include, but are not limited to: 3-aminopropyl-trimethoxy silane, vinyl aminomethyl triacetoxysilane, and the like. Of the aforementioned amino silanes, it is highly preferred to use 3-aminopropyl-trimethoxy silane as the second layer of the bi-layer capping coating of the present invention.

As stated above, the first layer of inventive bi-layer capping coating is a silicon nitride layer. The process of depositing silicon nitride is well known. Illustrative methods that can be used in the present invention to deposit the silicon nitride layer of the bi-layer capping coating include, for example, spin-coating, chemical vapor deposition (CVD), plasma enhanced chemical vapor deposition (PECVD), chemical solution deposition, atomic layer deposition, evaporation, physical vapor deposition (PVP), and other like deposition processes.

The silicon nitride layer of the bi-layer capping coating of the present invention exhibits good adhesion properties to materials used in the back-end-of the-line (BEOL) processing, namely conductive materials such as Cu, and dielectric films including, for example, silicon dioxide, oxide films containing phosphorus or boron, such as phosphorus doped silicate glass (PSG), boron doped silicate glass (BSG), and boron-phosphorus doped silicate glass (BPSG), a silicon oxynitride, nitrides, and other low-k organic and non-organic films. Also silicon nitride allows for good chemical mechanical polishing (CMP) process selectivity to the aforementioned materials. Therefore, in Cu-dual damascene structures, it is used as a CMP hard mask.

The above characteristics of silicon nitride allow this insulating material to be utilized as a capping layer in applications in which metal capping layers failed. Namely, silicon nitride can be deposited over the surface of the to-be-transferred layer (with Cu patterned structure) followed by the amino silane deposition (formation of the bi-layer cap). Subsequently, the layer transfer steps are implemented (deposition of polyimide adhesives, attachment of glass, removal of the bulk silicon, bonding to a new substrate, release of glass carrier, strip of polyimide).

In embodiments wherein the silicon nitride is deposited over an interconnect structure containing Cu metallurgy, the silicon nitride serves as a Cu protection layer, preventing Cu oxidation. Depending on the processing scheme, the silicon nitride layer can be easily removed by well-known wet or dry etching processes, or simply (and preferably) by a CMP process. In such a scheme, silicon nitride would serve as a sacrificial layer. For other 3D applications, the silicon nitride layer can be left on as a constituent of the structure, and it can be, for example, used as a passivation layer or as an etch stop layer to add additional wiring layers.

In this invention, the bi-layer capping layer is proposed for CMOS-compatible processes related to 3D integration applications, hence it is expected that the thermal budget will not exceed 400° C. The thermal stability of silicon nitride has been well documented for such applications. On the other hand, thermal stability of the amino silane/polyimide system depends on the processing ambient. The degradation under nitrogen is minimal at 400° C. (16 hours), but air enriched nitrogen probably causes oxidation and decomposition of unreacted surface amino silane.

However, the application of present invention is related to polyimide materials which have to be cured in an oxygen-free ambient. Hence, without any added restrictions the stability of the amino silane-polyimide interface is insured. All of the above information leads to the conclusion that silicon nitride/amino silane system is an excellent capping bi-layer for 3D integration applications when Cu-polyimide interfaces are involved.

The prior art structure of the assembly approach technique used in 3D integration applications is shown in FIG. 1. The structure consists of: a layered structure-to-be transferred 100, which includes bulk silicon 101 and device layer 102 terminated by the Cu patterned wiring level 103; capping layer 200; sacrificial polyimide layer 300; adhesion layer 400; and glass carrier 500. In such a structure, only an amino silane, such as 3-aminopropyl-trimethoxy silane, is used as the capping layer 200.

Amino silanes serve as adhesion promoters for patterned Si BEOL structures enabling increased strength in the Cu-polyimide and dielectric-polyimide interfaces. In addition, amino silanes serve as Cu diffusion barriers, limiting the creation of Cu-containing precipitates in the polyimide. However, upon plasma exposure the amino silane reduces simply to a layer of silicon oxide and electrical evaluation of the layer transfer process using this scheme showed increased Cu wire resistivity. Hence, it has been concluded that Cu surface degraded during the oxygen-plasma removal of the polyimide, caused by oxidation was not prevented by the silicon oxide layer resulting from the oxidized amino silane.

The present invention is based on a bi-layer approach, i.e., the previous single capping layer 200 in this scheme is substituted by a capping layer 200' which is comprised of two films: silicon nitride 201' underneath the amino silane layer 202'. The schematic diagram of the inventive structure is shown, for example, in FIG. 2. The combined properties of the silicon nitride 201' (oxygen diffusion barrier layer with good adhesion properties to BEOL materials), and amino silane layer 202' (adhesion promoter to polyimide) provides superior capping layer characteristics.

Figure 2:
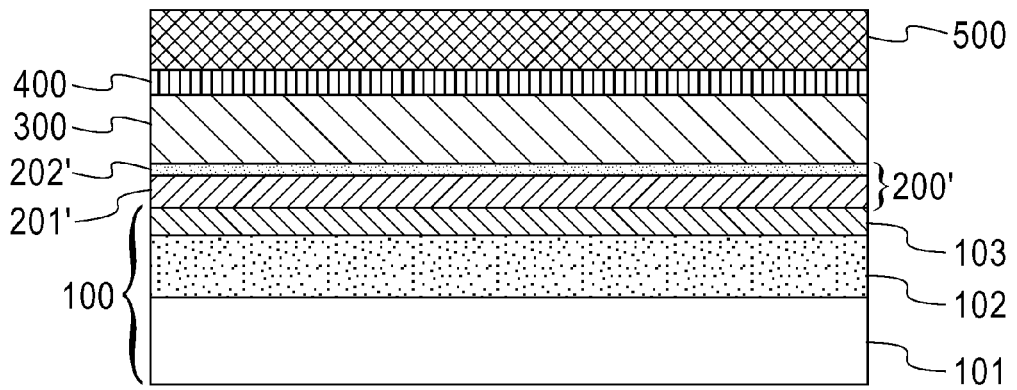
FIG. 2 is a schematic representation of a structure of the present invention including a bi-layer capping coating.

In FIG. 2, reference numeral 100 denotes a layered substrate to be transferred. The layered substrate 100 includes a semiconductor substrate 100, device layer 102 which can be terminated with a layer 103 that comprises at least one metallic element such as Ti, Ta, Zr, Hf, silicides, nitrides and conducting siliconnitrides of the aforementioned elemental metals; Cu, W, Al, composites of these metals with glass; and any combination thereof. Preferably, layer 103 comprises Cu. The metallic element of layer 103 may be patterned, i.e., a patterned wiring level, or a blanket layer. When a patterned metallic element is present, portions of layer 103 may be comprised of an insulating material including oxides, nitrides, oxynitrides, polymeric dielectrics and inorganic dielectrics. The insulating material may be porous or non-porous. The layered substrate 100 is fabricated using any well-known semiconductor processing technique.

The semiconductor substrate 101 may be a bulk semiconductor including, for example, Si, SiGe, SiC, SiGeC, GaAs, InP, InAs and other III-V compound semiconductors, II-V compound semiconductors, or layered semiconductors such as silicon-on-insulators (SOI), SiC-on-insulator (SiCOI) or silicon germanium-on-insulators (SGOI). When the layered semiconductors are employed, the top layer of those substrates represent the device layer 102.

FIG. 2 also shows an example of a carrier assembly that can be employed in the present invention. The carrier assembly may include a carrier wafer 500, adhesion layer 400 and intermediate layer 300. The carrier assembly is fabricated using techniques that are well-known in the art. For example, the carrier assembly can be formed by applying an adhesive coating atop a carrier wafer using a conventional deposition process such as spin-on coating, PECVD, CVD or physical vapor deposition (PVP). The intermediate layer is then applied by using one of the above mentioned deposition processes. In a preferred embodiment, the carrier assembly comprises glass and an intermediate layer of a polyimide.

Carrier wafer 500 may be comprised of a semiconductor including any group III-V or II-V semiconductor, SOI, SGOI, alumina, ceramics and the like. Intermediate layer 300 of the carrier assembly is any polyimide material, which is typically used as an adhesive coating in such a structure. Examples of polyimide materials that can be employed in the present invention include polyamic acid (PAA)-based polyimides, polyimic ester-based polyimides and pre-imidized polyimides.

Adhesion layer 400 includes coupling agents such as amino silanes. Adhesion layer 400 serves to bond the carrier wafer 500 to the intermediate layer 300.

The 3D structures transferred using this bi-layer (silicon nitride/amino silane) approach preserved circuit performance, indicating that the inventive bi-layer capping coating reliably performs its function.

This invention is based on the use of the wafer-level layer transfer process which incorporates the inventive bi-layer capping coating described above. This type of passivation material is proposed since it is compatible with current CMOS technology. Specifically, the wafer-level layer transfer method of the present invention includes first providing a layer to be transferred on a semiconductor substrate using well known CMOS process steps. The first layer of the inventive capping coating, e.g., silicon nitride, which provides good adhesion and protection from oxidation for the layer to be transferred is then formed using a conventional deposition process such as spin on coating, PECVD, CVD or PVP. Next, the second layer of the inventive capping coating, i.e., the amino silane, which serves as an additional diffusion barrier and provides adhesion to the carrier assembly is applied to the first layer using spin on coating, PECVD, CVD or PVP. The carrier assembly comprising the intermediate layer attached to a carrier wafer by means of suitable adhesive is then adhered to the second layer. After this step, the semiconductor substrate is removed such that the layer to be transferred is attached to the carrier assembly thus achieving layer transfer. The removal may be achieved by laser ablation or etching.

The method of the present invention may further comprise the steps of joining an exposed surface of the transferred layer to a top surface of a receiver substrate, and removing the carrier assembly to achieve further transfer of the transferred layer from the carrier assembly to the receiver substrate.

In this embodiment, the semiconductor and receiver substrates contain semiconductor components and the carrier assembly is used to enable the layer transfer of the semiconductor components from semiconductor substrate onto semiconductor components from the receiver substrate.

The focus of this invention is on ability to integrate multifunctional 3D structures with active and passive components by coating their interconnecting elements with passivation layer to protect them from degradation during the layer transfer process.

The concepts disclosed in the present invention can be used to add functionality to the 3D ICs without deviating from the spirit of the invention. For example, the methods can be applied to future optoelectronic device structures. In such cases, firstly the type of the material to create the layers can be replaced by other materials such as II-VI and III-V materials, (example: gallium arsenide or indium phosphide) and organic materials, and should be selected according to the specific application however similar bi-layer passivation can be used to preserve electrical and mechanical stability of the semiconductor elements. Secondly the functional bi-layer can be an integral part of an optoelectronic structure, including future 3-dimensional circuit stacks, allowing for integration of complex multifunctional and mixed-technology systems or elements on a single wafer.

While the present invention has been particularly shown and described with respect to preferred embodiments, it will be understood by those skilled in the art that the foregoing and other changes in forms and details may be made without departing from the spirit and scope of the present invention. It is therefore intended that the present invention not be limited to the exact forms and details described and illustrates, but fall within the scope of the appended claims.

What is claimed is:

1. A method for wafer-level layer transfer comprising the steps of:
   providing a layer to be transferred on a semiconductor substrate;
   forming a first layer of a capping coating comprising a nitride-containing material on said layer to be transferred, wherein said first layer provides adhesion and protection from oxidation;
   forming a second layer of the capping coating comprised of an amino silane material on said first layer, wherein said second layer provides additional protection and adhesion to a carrier assembly and wherein the amino silane material is represented by the formula:

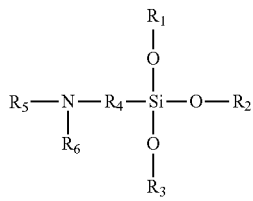

wherein:
   each of $R_1, R_2, R_3$ is independently hydrogen, $C_1$-$C_6$ alkyl, $C_1$-$C_6$ acyl, $C_2$-$C_6$ allyl, $C_2$-$C_6$ alkenyl, or $C_2$-$C_6$ alkynyl,
   $R_4$ is $C_1$-$C_6$ alkyl, phenyl, or benzyl, and
   each of $R_5$ and $R_6$ is independently $C_1$-$C_6$ alkyl, $C_1$-$C_6$ acyl, $C_2$-$C_6$ alkyl, $C_2$-$C_6$ alkenyl, or $C_2$-$C_6$ alkynyl;
   adhering said carrier assembly to a carrier wafer by bonding; and
   removing said semiconductor substrate such that said layer to be transferred is attached to said carrier assembly thereby achieving layer transfer of a device layer.

2. The method of claim 1, wherein the layered to be transferred includes a wiring level.

3. The method according to claim 2, further comprising the steps of joining an exposed surface of said layer to be transferred including the wiring level to a top surface of a receiver substrate, removing said carrier assembly to achieve further transfer of said layer to be transferred from said carrier assembly to said receiver substrate.

4. The method according to claim 3, wherein said semiconductor and receiver substrates contain semiconductor components and said carrier assembly is used to enable the layer transfer of said semiconductor components from the semiconductor substrate on to the semiconductor components from the receiver substrate.

5. The method according to claim 4, wherein the semiconductor and receiver substrates are selected from the group consisting of silicon, silicon on insulator, II-VI compounds, III-V compounds, alumina and quartz.

6. The method according to claim 4, wherein said semiconducting components are selected from the group comprising of semiconductor devices, semiconductor circuits, thin-film layers, passive and active elements, interconnecting elements, memory elements, micro-electro-mechanical elements, optical elements, optoelectronic elements, and photonic elements.

7. The method according to claim 1, wherein said carrier wafer adheres to an intermediate layer made of polyimide.

8. The method according to claim 7, wherein said release process of said carrier wafer is based on a laser ablation process where polyimide absorbs all the energy allowing for separation of a wafer carrier from the structure.

9. The method of claim 2, wherein the wiring level is comprised of at least one of Ti, Ta, Z, Hf, Cu, Al and alloys thereof.

* * * * *